(12) United States Patent
Qi et al.

(10) Patent No.: US 11,831,321 B2
(45) Date of Patent: Nov. 28, 2023

(54) CLOCK SIGNAL GENERATION CIRCUIT AND METHOD, AND ELECTRONIC DEVICE

(71) Applicant: BOE Technology Group Co., Ltd., Beijing (CN)

(72) Inventors: Aixiang Qi, Beijing (CN); Xiangye Wei, Beijing (CN); Yiming Bai, Beijing (CN); Jie Feng, Beijing (CN); Shuai Wang, Beijing (CN); Kening Zhao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/772,482

(22) PCT Filed: Jun. 8, 2021

(86) PCT No.: PCT/CN2021/099018
§ 371 (c)(1),
(2) Date: Apr. 27, 2022

(87) PCT Pub. No.: WO2022/017033
PCT Pub. Date: Jan. 27, 2022

(65) Prior Publication Data
US 2022/0345136 A1    Oct. 27, 2022

(30) Foreign Application Priority Data
Jul. 23, 2020   (CN) .......................... 202010718719.4

(51) Int. Cl.
*H03L 7/083*   (2006.01)
*H03K 3/017*   (2006.01)
*H03K 19/17784*   (2020.01)
*H03L 7/099*   (2006.01)

(52) U.S. Cl.
CPC ............. *H03L 7/083* (2013.01); *H03K 3/017* (2013.01); *H03K 19/17784* (2013.01); *H03L 7/0995* (2013.01)

(58) Field of Classification Search
CPC ......... H03L 7/083; H03L 7/0995; H03L 7/18; H03K 3/017; H03K 19/17784; H03K 3/84; H03K 3/02
See application file for complete search history.

(56) References Cited

U.S. PATENT DOCUMENTS

| | | | |
|---|---|---|---|
| 7,330,078 B1 * | 2/2008 | Li | ............................. H03L 7/18 375/376 |
| 2009/0232190 A1 | 9/2009 | Yoshizawa | |
| 2021/0242874 A1 | 8/2021 | Ma et al. | |

FOREIGN PATENT DOCUMENTS

| | | |
|---|---|---|
| CN | 101867356 A | 10/2010 |
| CN | 202513907 U | 10/2012 |
| CN | 108964660 A | 12/2018 |

(Continued)

*Primary Examiner* — Jung Kim
(74) *Attorney, Agent, or Firm* — IPro, PLLC

(57) ABSTRACT

Provided is a clock signal generation circuit. The clock signal generation circuit includes a control word generation circuit, an initial clock generation circuit and a spread spectrum clock generation circuit, wherein the control word generation circuit is connected to the initial clock generation circuit and the spread spectrum clock generation circuit; the initial clock generation circuit is further connected to the spread spectrum clock generation circuit.

20 Claims, 7 Drawing Sheets

(56) References Cited

FOREIGN PATENT DOCUMENTS

| CN | 110214418 A | 9/2019 |
|---|---|---|
| CN | 110708061 A | 1/2020 |

\* cited by examiner

CLOCK SIGNAL GENERATION CIRCUIT AND METHOD, AND ELECTRONIC DEVICE

CROSS-REFERENCE TO RELATED APPLICATION

The present disclosure is a US national stage of international application No. PCT/CN2021/099018, filed on Jun. 8, 2021, which claims priority to Chinese Patent Application No. 202010718719.4, filed on Jul. 23, 2020, and entitled "CLOCK SIGNAL GENERATION CIRCUIT AND METHOD, AND ELECTRONIC DEVICE", the contents of which are incorporated herein by reference in their entireties.

TECHNICAL FIELD

The present disclosure relates to the field of communications technologies, and in particular relates to a clock signal generation circuit and method, and an electronic device.

BACKGROUND

Spread spectrum is a technology that disperses the spectrum energy of clock signals to effectively suppress electromagnetic interference generated during operation of an electronic device.

In the related art, the spread spectrum function is generally achieved by arranging a phase-locked loop circuit in combination with jitter.

SUMMARY

The present disclosure provides a clock signal generation circuit and method, and an electronic device. The technical solutions are as follows.

In an aspect, a clock signal generation circuit is provided. The clock signal generation circuit includes a control word generation circuit, an initial clock generation circuit and a spread spectrum clock generation circuit, wherein the control word generation circuit is connected to the initial clock generation circuit and the spread spectrum clock generation circuit, and the control word generation circuit is configured to generate a first frequency control word, a second frequency control word and a third frequency control word based on a spread spectrum parameter, output the first frequency control word and the second frequency control word to the initial clock generation circuit, and output the third frequency control word to the spread spectrum clock generation circuit;

the initial clock generation circuit is further connected to the spread spectrum clock generation circuit, and the initial clock generation circuit is configured to generate an initial clock signal with a target duty ratio based on the first frequency control word and the second frequency control word and output the initial clock signal to the spread spectrum clock generation circuit; and the spread spectrum clock generation circuit is configured to perform spread spectrum processing on the initial clock signal based on the target duty ratio of the initial clock signal and the third frequency control word to acquire a spread spectrum clock signal.

Optionally, the spread spectrum clock generation circuit includes a voltage conversion sub-circuit, a first reference clock generation sub-circuit and a spread spectrum clock generation sub-circuit, wherein the voltage conversion sub-circuit is connected to the initial clock generation circuit and the first reference clock generation sub-circuit, and the voltage conversion sub-circuit is configured to convert an initial voltage to a target voltage based on the target duty ratio of the initial clock signal and provide the target voltage to the first reference clock generation sub-circuit;

the first reference clock generation sub-circuit is further connected to the spread spectrum clock generation sub-circuit, and the first reference clock generation sub-circuit is configured to generate a plurality of first reference clock signals under drive of the target voltage and output the plurality of first reference clock signals to the spread spectrum clock generation sub-circuit, wherein a phase difference between every two adjacent first reference clock signals is the same; and the spread spectrum clock generation sub-circuit is further connected to the control word generation circuit, and the spread spectrum clock generation sub-circuit is configured to perform the spread spectrum processing on the initial clock signal based on the third frequency control word and the plurality of first reference clock signals to acquire the spread spectrum clock signal.

Optionally, the first reference clock generation sub-circuit includes a first ring oscillator (RO).

Optionally, the spread spectrum clock generation sub-circuit includes a first input unit, a first selection unit and a first output unit, wherein the first input unit is connected to the control word generation circuit and the first selection unit, and the first input unit is configured to output a first selection control signal to the first selection unit based on the third frequency control word;

the first selection unit is further connected to the first reference clock generation sub-circuit and the first output unit, and the first selection unit is configured to select a first candidate clock signal from the plurality of first reference clock signals in response to the first selection control signal and output the first candidate clock signal to the first output unit; and the first output unit is configured to perform the spread spectrum processing on the initial clock signal based on the first candidate clock signal to acquire the spread spectrum clock signal.

Optionally, the clock signal generation circuit further includes: a power supply, wherein the power supply is connected to the voltage conversion sub-circuit, and the power supply is configured to provide the initial voltage to the voltage conversion sub-circuit.

Optionally, the initial clock generation circuit includes a second reference clock generation sub-circuit and an initial clock generation sub-circuit, wherein the second reference clock generation sub-circuit is connected to the initial clock generation sub-circuit, and the second reference clock generation sub-circuit is configured to generate a plurality of second reference clock signals under drive of a reference voltage and output the plurality of second reference clock signals to the initial clock generation sub-circuit, wherein a phase difference between any two adjacent second reference clock signals is the same; and the initial clock generation sub-circuit is further connected to the control word generation circuit and the spread spectrum clock generation circuit, and the initial clock generation sub-circuit is configured to generate the initial clock signal based on the first frequency control word, the second frequency control word and the plurality of second reference clock signals and output the initial clock signal to the spread spectrum clock generation circuit.

Optionally, the second reference clock generation sub-circuit includes a second RO.

Optionally, the initial clock generation sub-circuit includes a second input unit, a second selection unit and a second output unit, wherein the second input unit is connected to the control word generation circuit and the second selection unit, and the second input unit is configured to output a second selection control signal to the second selection unit based on the first frequency control word and the second frequency control word;

the second selection unit is further connected to the second reference clock generation sub-circuit and the second output unit, and the second selection unit is configured to select a second candidate clock signal from the plurality of second reference clock signals in response to the second selection control signal and output the second candidate clock signal to the second output unit; and the second output unit is further connected to the spread spectrum clock generation circuit, and the second output unit is configured to generate the initial clock signal based on the second candidate clock signal and output the initial clock signal to the spread spectrum clock generation circuit.

Optionally, the first frequency control word and the second frequency control word are both positive integers.

Optionally, the third frequency control word includes an integer part and a fractional part.

Optionally, the spread spectrum parameter includes at least one of a modulation type parameter, a modulation depth parameter and a center frequency parameter.

In another aspect, a clock signal generation method is provided. The clock signal generation method includes:

generating, by a control word generation circuit, a first frequency control word, a second frequency control word and a third frequency control word based on a spread spectrum parameter, outputting, by the control word generation circuit, the first frequency control word and the second frequency control word to an initial clock generation circuit and the third frequency control word to a spread spectrum clock generation circuit;

generating, by the initial clock generation circuit, an initial clock signal with a target duty ratio based on the first frequency control word and the second frequency control word, and outputting, by the initial clock generation circuit, the initial clock signal to the spread spectrum clock generation circuit; and performing, by the spread spectrum clock generation circuit, spread spectrum processing on the initial clock signal based on the target duty ratio of the initial clock signal and the third frequency control word to acquire a spread spectrum clock signal.

Optionally, the spread spectrum clock generation circuit includes a voltage conversion sub-circuit, a first reference clock generation sub-circuit and a spread spectrum clock generation sub-circuit; and performing by the spread spectrum clock generation circuit the spread spectrum processing on the initial clock signal based on the target duty ratio of the initial clock signal and the third frequency control word to acquire the spread spectrum clock signal includes:

converting, by the voltage conversion sub-circuit, an initial voltage to a target voltage based on the target duty ratio of the initial clock signal, and providing, by the voltage conversion sub-circuit, the target voltage to the first reference clock generation sub-circuit;

generating, by the first reference clock generation sub-circuit, a plurality of first reference clock signals under drive of the target voltage, and outputting, by the first reference clock generation sub-circuit, the plurality of first reference clock signals to the spread spectrum clock generation sub-circuit, wherein a phase difference between any two adjacent first reference clock signals is the same; and performing, by the spread spectrum clock generation sub-circuit, the spread spectrum processing on the initial clock signal based on the third frequency control word and the plurality of first reference clock signals to acquire the spread spectrum clock signal.

In still another aspect, an electronic device is provided. The electronic device includes: a controlled circuit and the clock signal generation circuit described in the above aspect, wherein the clock signal generation circuit is connected to the controlled circuit, and the controlled circuit is configured to operate in response to a spread spectrum clock signal output from the clock signal generation circuit.

BRIEF DESCRIPTION OF THE DRAWINGS

To describe the technical solutions in the embodiments of the present disclosure more clearly, the following briefly describes the accompanying drawings required for describing the embodiments. Apparently, the accompanying drawings in the following description show merely some embodiments of the present disclosure, and those of ordinary skill in the art may still derive other drawings from these accompanying drawings without creative efforts.

DETAILED DESCRIPTION

In order to make the objectives, technical solutions and advantages of the embodiments of the present disclosure clearer, the invention concept of the embodiments of the present disclosure is described below with reference to the accompanying drawings and some embodiments.

Noise generated by a power supply and a clock signal generation circuit in an electronic device is the main source of electromagnetic interference. The noise generated by the power supply may generally be referred to as a noise floor, and the noise generated by the clock signal generation circuit may generally be referred to as characteristic frequency noise. The characteristic frequency noise has a more serious influence on the operation of the electronic device, and the characteristic frequency noise may occupy a key channel or couple with another circuit, which results in shift of the operating frequency of the electronic device or even results in abnormal operation or downtime of the electronic device.

Currently, the electromagnetic radiation outward may be reduced by adjusting the wiring on the circuit board to suppress electromagnetic interference. Alternatively, an iron shell may be used to shield the electromagnetic interference to cut off the propagation path of the electromagnetic interference. Alternatively, spread spectrum processing may be performed on the interference source (i.e., clock signals generated by the clock signal generation circuit) through jitter. The cost of adjusting the wiring or disposing the iron shell is higher. Before the spread spectrum processing is performed through jitter, the electronic device needs to be controlled to stop working. After the spread spectrum processing, the electronic device is restarted. This method affects the normal operation of the electronic device, and cannot adjust the modulation depth.

An embodiment of the present disclosure provides a clock signal generation circuit, which can achieve spread spectrum processing on the clock signal without affecting the normal operation of the electronic device, and can adjust the modulation depth, the center frequency and/or the modulation type in real time. The clock signal generation circuit can not only effectively suppress the electromagnetic interference, but also achieve more flexible spread spectrum than the related art. In addition, because the electronic device does not need to be controlled to stop working during the spread spectrum processing, the power consumption of the electronic device is reduced to some extent, and the robustness of the electronic device is improved.

Figure 1:
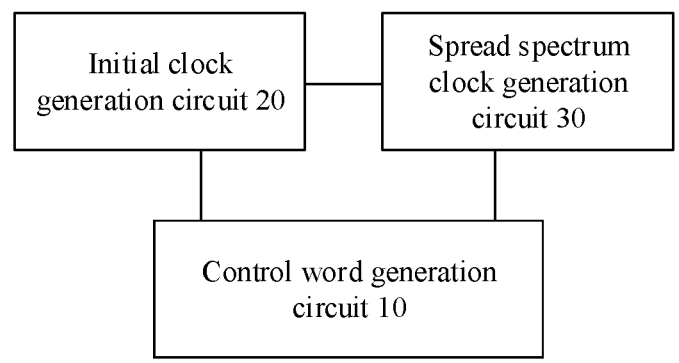
FIG. 1 is a schematic structural diagram of a clock signal generation circuit according to an embodiment of the present disclosure.

FIG. 1 is a schematic structural diagram of a clock signal generation circuit according to an embodiment of the present disclosure. As shown in FIG. 1, the clock signal generation circuit may include a control word generation circuit 10, an initial clock generation circuit 20 and a spread spectrum clock generation circuit 30.

The control word generation circuit 10 may be connected to the initial clock generation circuit 20 and the spread spectrum clock generation circuit 30. The control word generation circuit 10 may be configured to generate a first frequency control word, a second frequency control word and a third frequency control word based on a spread spectrum parameter, output the first frequency control word and the second frequency control word to the initial clock generation circuit 20, and output the third frequency control word to the spread spectrum clock generation circuit 30.

The spread spectrum parameter is a relevant parameter that affects an output result, i.e., the spread spectrum effect, of the spread spectrum clock generation circuit 30. In addition, the spread spectrum parameter may be entered into the control word generation circuit 10 by a user (for example, a developer), or the control word generation circuit 10 may be pre-configured with a plurality of different spread spectrum parameters for the user to select or for the control word generation circuit 10 to call directly. For example, the spread spectrum parameter may be a modulation depth.

The initial clock generation circuit 20 may be further connected to the spread spectrum clock generation circuit 30. The initial clock generation circuit 20 may be configured to generate an initial clock signal with a target duty ratio based on the first frequency control word and the second frequency control word, and output the initial clock signal to the spread spectrum clock generation circuit 30.

Optionally, it is assumed that the target duty ratio is represented in D, the first frequency control word is represented in F1, and the second frequency control word is represented in F2 (the same characters are used in all the following embodiments). The high-potential duration of the initial clock signal is related to the second frequency control word F2, and the low-potential duration of the initial clock signal is related to a difference F1-F2 between the first frequency control word F1 and the second frequency control word F2. In this case, the target duty ratio D of the initial clock signal generated by the initial clock generation circuit 20 may satisfy: D=F2/F1 formula (1).

The spread spectrum clock generation circuit 30 may be further configured to perform spread spectrum processing on the initial clock signal based on the target duty ratio of the initial clock signal and the third frequency control word to acquire a spread spectrum clock signal It should be noted that since both the initial clock generation circuit 20 and the spread spectrum clock generation circuit 30 operate based on the frequency control words provided by the control word generation circuit 10, the control word generation circuit 10 may also be referred to as a control block.

In summary, this embodiment of the present disclosure provides a clock signal generation circuit. In the clock signal generation circuit, digital circuits such as the control word generation circuit, the initial clock generation circuit, and the spread spectrum clock generation circuit first generate the frequency control words based on the spread spectrum parameter, generate the initial clock signal with the target duty ratio based on the frequency control words, and perform the spread spectrum processing based on the target duty ratio of the initial clock signals to acquire the spread spectrum clock signal. That is, the entire spread spectrum process is performed by the digital circuits. Therefore, the electronic device including the clock signal generation circuit does not need to be controlled to stop working, that is, the normal operation of the electronic device is not affected. In addition, the clock signal generation circuit provided in the present disclosure can adjust in real time various spread spectrum parameters (for example, the modulation depth) that affect the spread spectrum result, and thus the spread spectrum flexibility is high.

Optionally, the spread spectrum parameter may include at least one of a modulation type parameter, a modulation depth parameter and a center frequency parameter. The modulation type refers to the spread spectrum manner adopted for spread spectrum processing, such as linear modulation, and the modulation type determines a presentation form of the spread spectrum clock signal. The modulation depth refers to a magnitude of a frequency of the spread spectrum clock signal offsetting from a frequency of the initial clock signal at a fixed speed, and the modulation depth determines a peak value of the spread spectrum clock signal. The center frequency is the arithmetic mean of frequencies of the spread spectrum clock signal, and the center frequency determines the lowest frequency and highest frequency of the spread spectrum clock signal.

Figure 2:
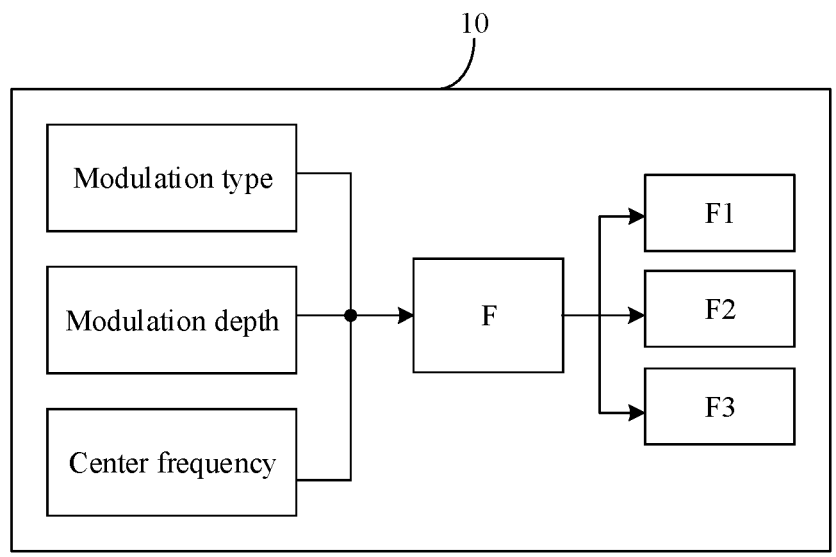
FIG. 2 is an architectural diagram of a control word generation circuit according to an embodiment of the present disclosure.

For example, the spread spectrum parameter is entered by a user. FIG. 2 is an architectural diagram of the control word generation circuit according to an embodiment of the present disclosure. As shown in FIG. 2, the control word generation circuit 10 may include an input interface for the modulation type, an input interface for the modulation depth, and an input interface for the center frequency, and the three input interfaces may be used by the user to enter the corresponding parameters based on the desired spread spectrum result. Still referring to FIG. 2, after receiving the spread spectrum parameter, the control word generation circuit 10 generally generates a total frequency control word F based on the spread spectrum parameter, splits the total frequency control word F into the first frequency control word F1, the second frequency control word F2 and the third frequency control word F3. The first frequency control word F1 and the second frequency control word F2 are provided to the initial clock generation circuit 20, and the third frequency control word F3 is provided to the spread spectrum clock generation circuit 30. The way of splitting depends on the desired spread spectrum result, which refers to the type, frequency and period of the spread spectrum clock signal expected to be generated. The spread spectrum result may usually be entered by the user into or pre-configured in the control word generation circuit 10.

Figure 3:
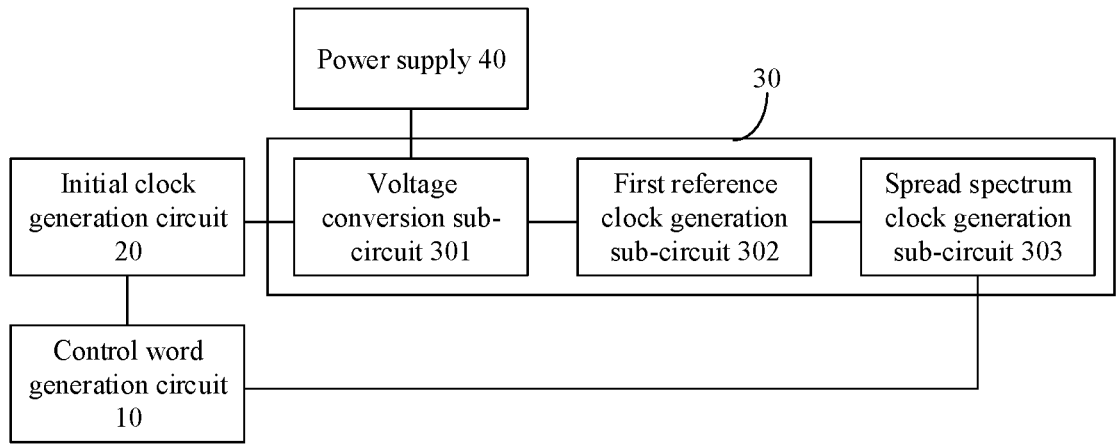
FIG. 3 is a schematic structural diagram of another clock signal generation circuit according to an embodiment of the present disclosure.

Optionally, FIG. 3 is a schematic structural diagram of another clock signal generation circuit according to an embodiment of the present disclosure. As shown in FIG. 3, the spread spectrum clock generation circuit 30 may include a voltage conversion sub-circuit 301, a first reference clock generation sub-circuit 302 and a spread spectrum clock generation sub-circuit 303.

The voltage conversion sub-circuit 301 may be connected to the initial clock generation circuit 20 and the first reference clock generation sub-circuit 302. The voltage conversion sub-circuit 301 may convert an initial voltage to a target voltage based on the target duty ratio of an initial clock signal and provide the target voltage to the first reference clock generation sub-circuit 302. Since the function of the voltage conversion sub-circuit 301 is voltage conversion, the voltage conversion sub-circuit 301 may also be referred to as a voltage switching circuit.

The target voltage may be positively correlated with both the target duty ratio and the initial voltage. That is, the bigger the target duty ratio is, the higher the target voltage is; and the smaller the target duty ratio is, the lower the target voltage is. Similarly, the higher the initial voltage is, the higher the target voltage is; and the lower the initial voltage is, the lower the target voltage is. In addition, the target voltage may be further positively correlated with the voltage conversion efficiency of the voltage conversion sub-circuit 301. That is, the higher the voltage conversion efficiency is, the higher the target voltage is; and the lower the voltage conversion efficiency is, the lower the target voltage is.

For example, assuming that the initial voltage is represented in Vi, the target voltage is represented in Vo, and the voltage conversion efficiency is represented in $\mu$, then the target voltage Vo may satisfy: $Vo=Vi \times \mu \times D$, where D is the target duty ratio.

Optionally, the initial voltage may be provided by a power supply module, such as a power supply. Correspondingly, still referring to FIG. 3, the clock signal generation circuit may further include a power supply 40. The power supply 40 may be connected to the voltage conversion sub-circuit 301 and provide the initial voltage to the voltage conversion sub-circuit 301.

Since the control word generation circuit 10 may generate different frequency control words based on different spread spectrum parameters, the initial clock generation circuit 20 may generate initial clock signals with different target duty ratios based on the different frequency control words. Correspondingly, the voltage conversion sub-circuit 301 may convert the initial voltage provided by the power supply 40 to different target voltages based on the different target duty ratios, such that the target voltage output to the first reference clock generation sub-circuit 302 is adjustable, which provides a foundation for subsequent spread spectrum.

Figure 4:
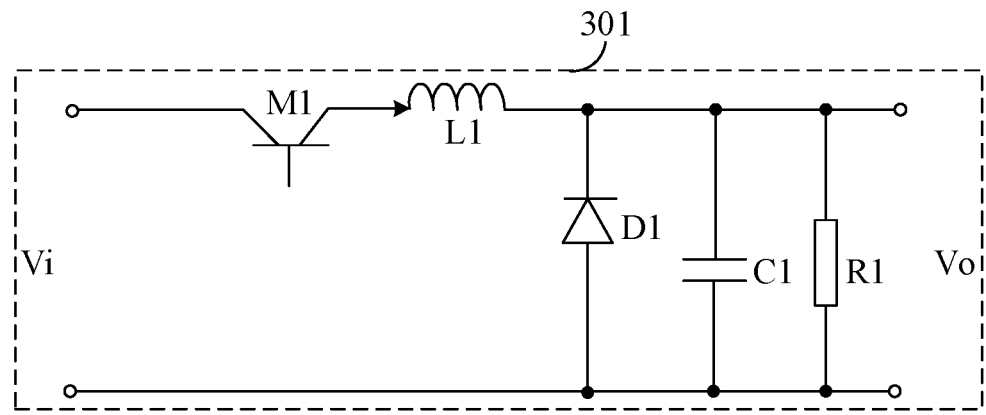
FIG. 4 is a schematic structural diagram of a voltage conversion sub-circuit according to an embodiment of the present disclosure.

Optionally, FIG. 4 is a schematic structural diagram of the voltage conversion sub-circuit 301 according to an embodiment of the present disclosure. As shown in FIG. 4, the voltage conversion sub-circuit 301 may include a triode M1, a diode D1, an inductor L1, a capacitor C1 and a resistor R1.

A gate of the triode M1 may be connected to the initial clock generation circuit 20 (not shown in FIG. 4), a first electrode of the triode M1 may be connected to a first electrode of the power supply 40, and a second electrode of the triode M1 may be connected to one end of the inductor L1. The other end of the inductor L1 may be connected to one end of the diode D1, one end of the capacitor C1 and one end of the resistor R1, and may be connected to a first terminal of the first reference clock generation sub-circuit 302 (not shown in FIG. 4). The other end of the diode D1, the other end of the capacitor C1, and the other end of the resistor R1 each may be connected to a second electrode of the power supply 40 and a second terminal of the first reference clock generation sub-circuit 302 (not shown in FIG. 4).

The voltage conversion principle is described with reference to the voltage conversion sub-circuit 301 shown in FIG. 4. The initial clock generation circuit 20 may output the generated initial clock signal with the target duty ratio to the gate of the triode M1. In this way, when the potential of the initial clock signal is an effective potential, the triode M1 is turned on and the initial voltage Vi may be output to one end of the inductor L1 through the triode M1 and then converted to the target voltage Vo through the inductor L1, the diode D1, the capacitor C1 and the resistor R1. When the potential of the initial clock signal is an ineffective potential, the triode M1 is turned off and the initial voltage Vi cannot be output to the end of the inductor L1 through the triode M1. Turn-on of the triode M1 may also be referred to as charging, and turn-off of the triode M1 may also be referred to as discharging.

Still referring to FIG. 3, the first reference clock generation sub-circuit 302 may be further connected to the spread spectrum clock generation sub-circuit 303. The first reference clock generation sub-circuit 302 may generate a plurality of first reference clock signals under drive of the target voltage and output the plurality of first reference clock signals to the spread spectrum clock generation sub-circuit 303. The phase difference between every two adjacent first reference clock signals may be the same, and the first reference clock signals have the same period and frequency.

Because the target voltage is adjustable, correspondingly, the frequency of the first reference clock signal generated by the first reference clock generation sub-circuit 302 is adjustable.

Figure 5:
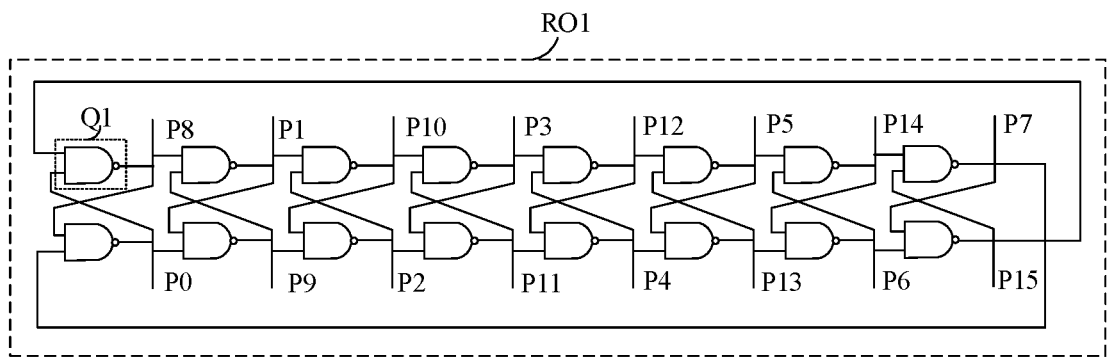
FIG. 5 is a schematic structural diagram of a first reference clock generation sub-circuit according to an embodiment of the present disclosure.

Optionally, the first reference clock generation sub-circuit 302 may include a first ring oscillator (RO), i.e., RO1. The first RO RO1 may consist of a plurality of NAND gates, and the first RO RO1 may generate 2N outputs in the case that there are N inputs, where N usually equals $2^n$, and n is greater than or equal to 2. For example, N is 8, and FIG. 5 is a schematic structural diagram of the first RO RO1. Referring to FIG. 5, it can be seen that the first RO RO1 includes 16 output terminals P1 to P16, and the first RO RO1 (that is, the first reference clock generation sub-circuit 302) may be connected to the spread spectrum clock generation sub-circuit 303 through the 16 output terminals P1 to P16.

Figure 6:
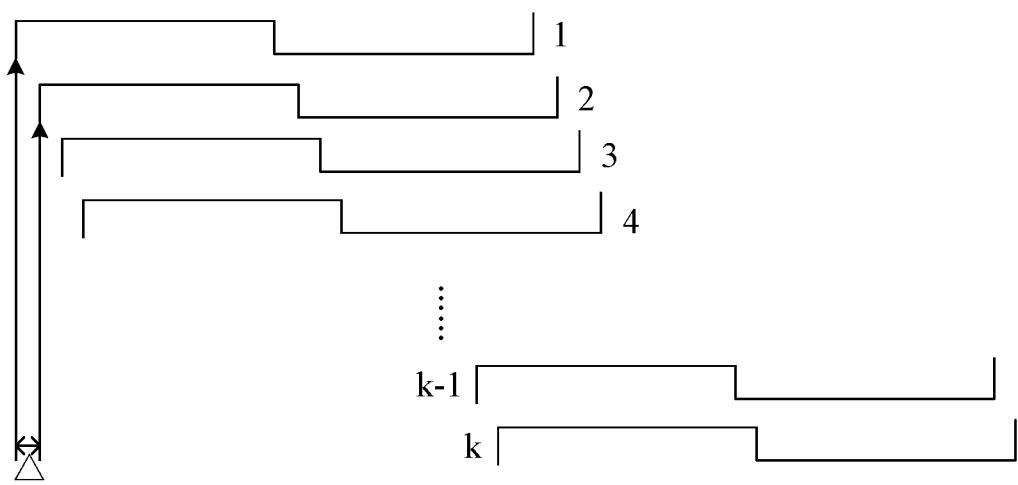
FIG. 6 is a schematic diagram of first reference clock signals according to an embodiment of the present disclosure.

For example, FIG. 6 is a schematic diagram of a plurality of first reference clock signals by taking an example where the first reference clock generation sub-circuit 302 generates a total of k first reference clock signal. In addition, it can be seen from FIG. 6 that the phase difference between every two adjacent first reference clock signals is Δ.

It should be noted that the quantity k of the first reference clock signals that can be generated by the first reference clock generation sub-circuit 302 may be pre-configured in the first reference clock generation sub-circuit 302. For example, the quantity k may be set in the circuit by the user during production. Further, k may be $2^i$, and i may be an integer greater than or equal to 1. For example, k may be 16, 32, 128, or the like.

Still referring to FIG. 3, the spread spectrum clock generation sub-circuit 303 may be further connected to the control word generation circuit 10, and the spread spectrum clock generation sub-circuit 303 may be configured to perform spread spectrum processing on the initial clock signal based on the third frequency control word and the plurality of first reference clock signals, to acquire a spread spectrum clock signal.

The period of the spread spectrum clock signal may be negatively correlated with the third frequency control word, the frequency of the first reference clock signal and the quantity of the generated first reference clock signals. That is, the larger the third frequency control word is, the shorter the period of the spread spectrum clock signal is; and the smaller the third frequency control word is, the longer the period of the spread spectrum clock signal is. Similarly, the higher the frequency of the first reference clock signal is, the shorter the period of the spread spectrum clock signal is; and the lower the frequency of the first reference clock signal is, the longer the period of the spread spectrum clock signal is. The larger the quantity of the first reference clock signals is, and shorter the period of the spread spectrum clock signal is; and the smaller the quantity of the first reference clock signals is, the longer the period of the spread spectrum clock signal is.

For example, assuming that the frequency of each first reference clock signal is represented in f1 and a total of k first reference clock signals are generated, then the period T0 of the spread spectrum clock signal may satisfy: T0=1/(F3× k×f1) formula (2). F3 is the third frequency control word.

By setting the spread spectrum clock generation sub-circuit 303, the output range of the first reference clock generation sub-circuit 302 can be further expanded, which increases the adjustability of the spread spectrum clock signal. In addition, to increase the adjustability of the spread spectrum clock signal, the third frequency control word F3 may generally include an integer part and a fractional part.

Figure 7:
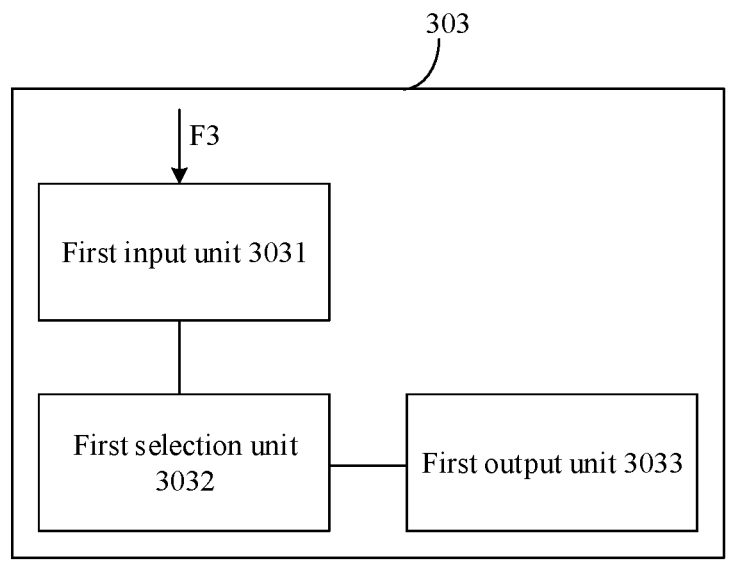
FIG. 7 is a schematic structural diagram of a spread spectrum clock generation sub-circuit according to an embodiment of the present disclosure.

Optionally, FIG. 7 is a schematic structural diagram of the spread spectrum clock generation sub-circuit 303 according to an embodiment of the present disclosure. As shown in FIG. 7, the spread spectrum clock generation sub-circuit 303 may include: a first input unit 3031, a first selection unit 3032 and a first output unit 3033.

The first input unit 3031 may be connected to the control word generation circuit 10 (not shown in the figure) and the first selection unit 3032. The first input unit 3031 may be configured to output a first selection control signal to the first selection unit 3032 based on the third frequency control word F3.

The first selection unit 3032 may be further connected to the first reference clock generation sub-circuit 302 (not shown in the figure) and the first output unit 3033. The first selection unit 3032 may be configured to select a first candidate clock signal from the plurality of first reference clock signals in response to the first selection control signal, and output the first candidate clock signal to the first output unit 3033.

The first output unit 3033 may be configured to perform the spread spectrum processing on the initial clock signal based on the first candidate clock signal, to acquire the spread spectrum clock signal.

Figure 8:
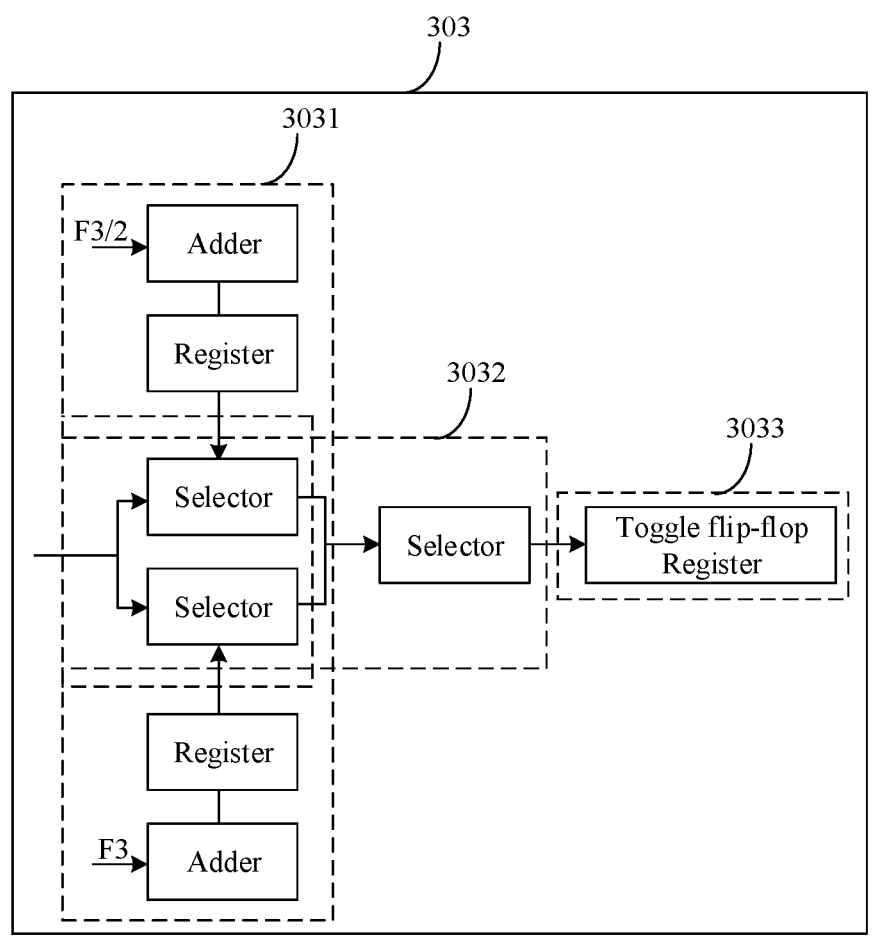
FIG. 8 is a schematic structural diagram of another spread spectrum clock generation sub-circuit according to an embodiment of the present disclosure.

For example, referring to FIG. 8, the first input unit 3031 may include a plurality of registers and a plurality of adders, the first selection unit 3032 may include three selectors, and the first output unit 3033 may include a toggle flip-flop. For example, referring to FIG. 9, the registers may include a first register R1, a second register R2, a third register R3 and a fourth register R4. The adders may include two adders J11 and J12. The selectors may include a first selector X1, a second selector X2 and a third selector X3. The toggle flip-flop may include a D flip-flop, a first inverter F1 and a second inverter F2.

Figure 9:
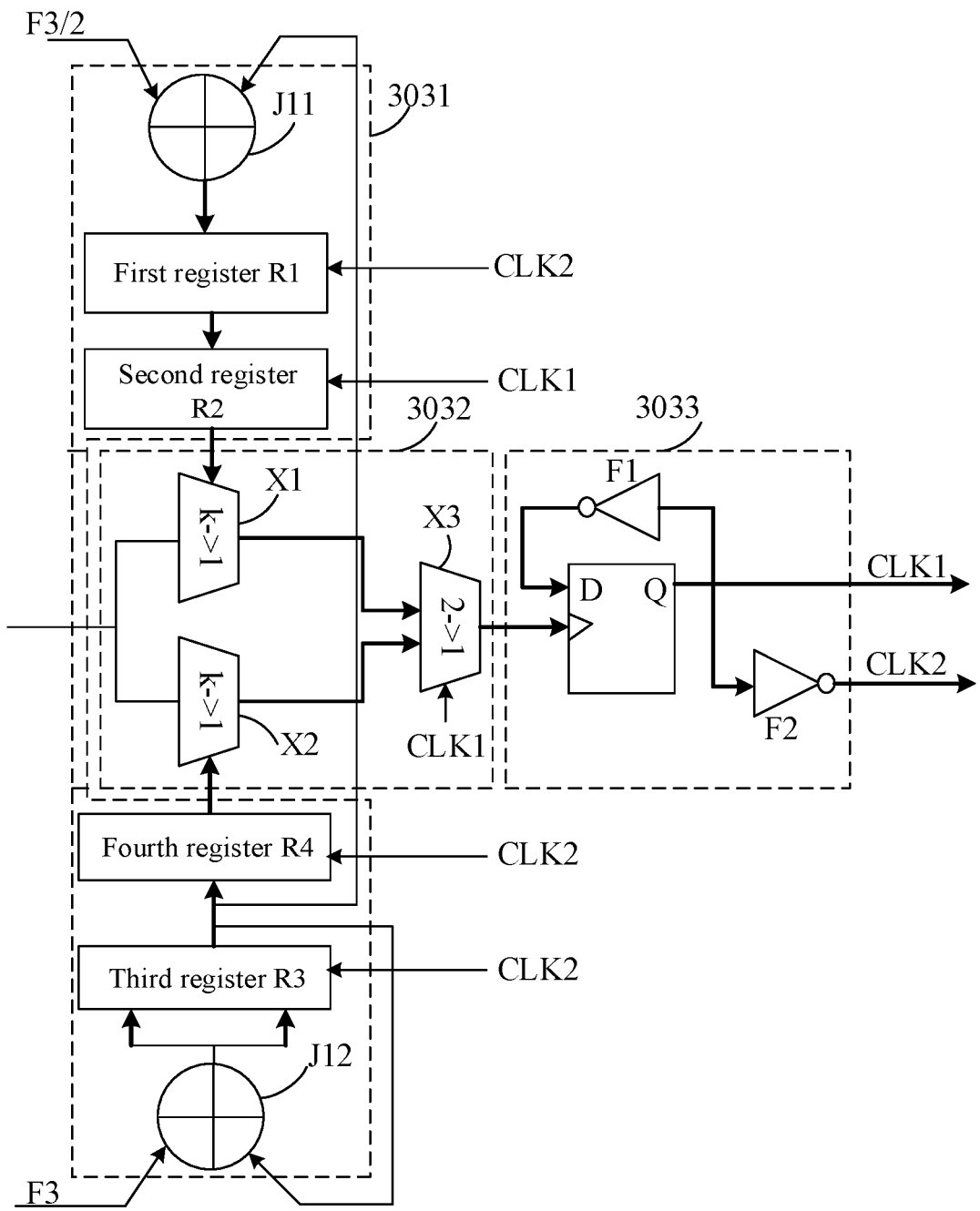
FIG. 9 is a schematic structural diagram of still another spread spectrum clock generation sub-circuit according to an embodiment of the present disclosure.

The two adders J11 and J12 both may be connected to the control word generation circuit 10. The adder J11, the first register R1, the second register R2 and the first selector X1 are sequentially connected, and the adder J12, the third register R3, the fourth register R4 and the second selector X2 are sequentially connected. For example, the two adders J11 and J12 shown in FIG. 9 are both connected to a connection line between the third register R3 and the fourth register R4. The first selector X1 and the second selector X2 both may be connected to the first reference clock generation sub-circuit 302 and the third selector X3, and the third selector X3 may be further connected to a first input terminal of the D flip-flop. A second input terminal of the D flip-flop may be connected to an output terminal of the first inverter F1, an input terminal of the first inverter F1 and an input terminal of the second inverter F2 may be both connected to an output terminal of the D flip-flop. In addition, referring to FIG. 9, the output terminal of the D flip-flop may serve as the output of a first clock signal terminal CLK1, an output terminal of the second inverter F2 may serve as the output of a second clock signal terminal CLK2, and clock signals provided by the first clock signal terminal CLK1 and the second clock signal terminal CLK2 are only opposite in phase and have the same frequency.

For example, assuming that the first reference clock generation sub-circuit 302 generates a total of k first reference clock signals, then the first selector X1 and the second selector X2 may both be the k->1 selector in FIG. 9 (that is, one first reference clock signal is selected from the k first reference clock signals). Because the third selector X3 is configured to select one from two, with reference to FIG. 9, the third selector X3 may be a 2->1 selector (that is, one first candidate clock signal is selected from two first reference clock signals).

In combination with FIG. 9, the principle of generating the spread spectrum clock signal by the spread spectrum clock generation sub-circuit 303 is described by taking an example in which the second register R2 and the third selector X3 are connected to the first clock signal terminal CLK1, and the first register R1, the third register R3 and the fourth register R4 are all connected to the second clock signal terminal CLK2.

For example, the adder J11 may add a part of the third frequency control word F3 (for example, F3/2 shown in FIG. 9) and the most significant bit (for example, 5 bits) stored in the third register R3, and store the result of the addition in the first register R1 on the rising edge of the second clock signal provided by the second clock signal terminal CLK2. Alternatively, the adder J11 may add a part of the third frequency control word F3 and all information stored in the third register R3, and store the result of the addition in the first register R1 on the rising edge of the second clock signal. On the rising edge of a next first clock signal, the most significant bit stored in the first register R1 is stored in the second register R2 and used as a selection signal of the first selector X1. Accordingly, the first selector X1 may select, in response to the selection signal, one of the k first reference clock signals as an output signal of the first selector X1, and output the output signal to the third selector X3.

Similarly, the other adder J12 may add the third frequency control word F3 and the most significant bit stored in the third register R3, and store the result of the addition in the third register R3 on the rising edge of the second clock signal CLK2. Alternatively, the other adder J12 may add the third frequency control word F3 and all information stored in the third register R3, and store the result of the addition in the third register R3 on the rising edge of the second clock signal CLK2. On the rising edge of the next second clock signal, the most significant bit stored in the third register R3 is stored in the fourth register R4 and used as a selection signal of the second selector X2. Accordingly, the second selector X2 may select, in response to the selection signal, one of the k first reference clock signals as an output signal of the second selector X2, and output the output signal to the third selector X3.

Further, the third selector X3 may select one of the output signal from the first selector X1 and the output signal from the second selector X2 as an output signal of the third selector X3 on the rising edge of the first clock signal, and output the output signal to the D flip-flop to serve as an input clock signal of the D flip-flop. Then, a clock signal output from one of the output terminal of the D flip-flop and the output terminal of the second inverter F2 may serve as a final output signal, and the spread spectrum clock signal is generated.

Optionally, the selection signal output from the fourth register R4 may serve as a falling edge selection signal, the selection signal output from the second register R2 may serve as a rising edge selection signal, and the signal fed back by the third register R3 to the adder J12 may be configured to control switching of the period of the generated clock. Correspondingly, the selection signal output from the fourth register R4 may be referred to as a falling edge control word, and the selection signal output from the second register R2 may be referred to as a rising edge control word. The spread spectrum clock generation sub-circuit 303 in the embodiments of the present disclosure may be referred to as a Time-Average-Frequency Direct Period Synthesis (TAF-DPS) circuit. The operating principle of the TAF-DPS circuit may be based on time-average frequency (TAF).

Figure 10:
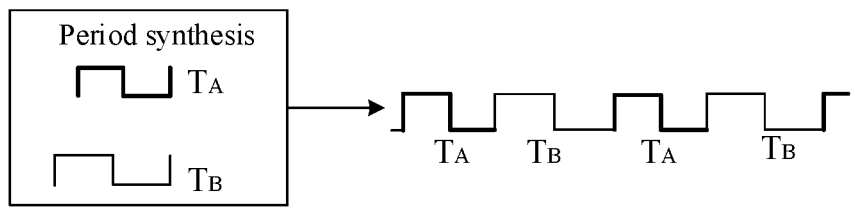
FIG. 10 is a schematic diagram of signal synthesis according to an embodiment of the present disclosure.

The operating principle of the TAF-DPS circuit is illustratively described with reference to FIG. 10.

Assuming that the frequency control word is F (for example, the third frequency control word F3), the phase difference between any two adjacent first reference clock signals is Δ, and F=I1+r1, where I1 represents the integer part and r1 represents the fractional part, then two clock signals with different periods can be output through TAF. Assuming that the period of one clock signal is $T_A$ and the period of the other clock signal is $T_B$, then $T_A$ and $T_B$ may satisfy:

$$T_A = I1 \times \Delta \qquad \text{formula (3), and}$$

$$T_B = (I1+1) \times \Delta \qquad \text{formula (4).}$$

The clock signal with the period $T_A$ and the clock signal with the period $T_B$ may be synthesized through the "period synthesis" technology to acquire a clock signal whose period is the target period, and the target period $T_{TAF}$ may satisfy:

$$T_{TAF} = (1-r1) \times T_A + r1 \times T_B \qquad \text{formula (5).}$$

By substituting formulas (3) and (4) into formula (5), it can be obtained that:

$$T_{TAF} = (I1+r1) \times \Delta = F \times \Delta \qquad \text{formula (6).}$$

It can be learned from formula (6) that r1 can determine the probability of occurrence of $T_B$, that is, the fractional part r1 of the frequency control word F may determine the switching frequency between the period $T_A$ and period $T_B$. The frequency $f_{TAF}$ of the clock signal output from the TAF-DPS circuit may be further calculated based on formula (6):

$$f_{TAF} = 1/T_{TAF} = 1/[(I1+r1) \times \Delta] = 1/F1(i) \times \Delta \qquad \text{formula (7).}$$

With reference to the above descriptions of the operating principle, the period T1 of the output signal of the spread spectrum clock generation sub-circuit 303 may satisfy:

$$T1 = F3 \times \Delta = (I11+r11) \times \Delta = (1-r11) \times T_A + r11 \times T_B \qquad \text{formula (8).}$$

I11 is the integer part of the third frequency control word F3, and r11 is the fractional part of the third frequency control word F3.

It can be known with reference to the above analysis of the principle that the spread spectrum clock generation sub-circuit 303 provided in this embodiment of the present disclosure may synthesize pulses (that is, clock signals) directly, instead of synthesizing frequencies synthesis conventionally. With this method, the electronic device may still maintain normal operation during switching of the clock frequency.

Figure 11:
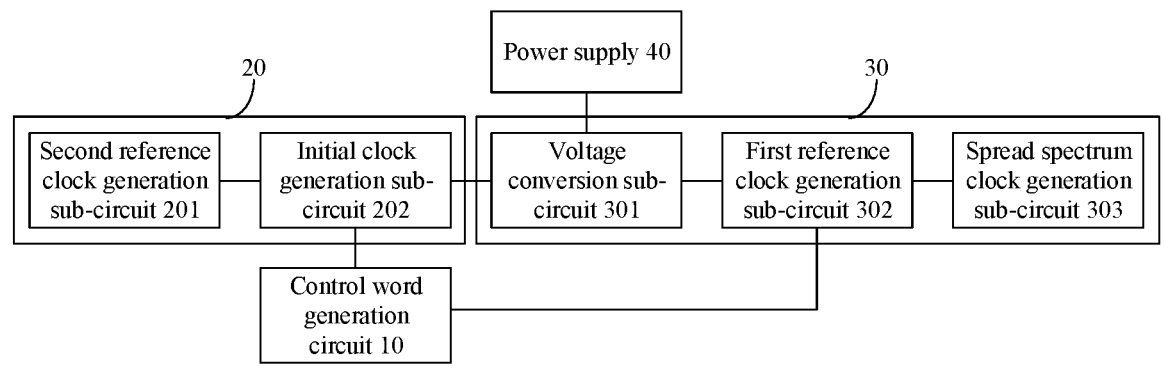
FIG. 11 is a schematic structural diagram of still another clock signal generation circuit according to an embodiment of the present disclosure.

FIG. 11 is a schematic structural diagram of still another clock signal generation circuit according to an embodiment of the present disclosure. As shown in FIG. 11, an initial clock generation circuit 20 may include a second reference clock generation sub-circuit 201 and an initial clock generation sub-circuit 202.

The second reference clock generation sub-circuit 201 may be connected to the initial clock generation sub-circuit 202. The second reference clock generation sub-circuit 201 may be configured to generate a plurality of second reference clock signals under drive of a reference voltage, and output the plurality of second reference clock signals to the initial clock generation sub-circuit 202. The phase difference between every two adjacent second reference clock signals is the same, and the second reference clock signals have the same frequency and period. For example, the frequency of each of the second reference clock signals is f2.

With reference to FIG. 5 and FIG. 6, the second reference clock generation sub-circuit 201 may include a second RO RO2. The structure and operating principle of the second RO RO2 are the same as those of the first RO RO1, and details are not described herein. The second RO RO2 (i.e., the second reference clock generation sub-circuit 201) and the first RO RO1 (i.e., the first reference clock generation sub-circuit 302) differ in that the second reference clock generation sub-circuit 201 operates at a fixed voltage (i.e., the reference voltage) and generates the second reference clock signal with a stable frequency, while the first reference clock generation sub-circuit 302 operates at a variable target voltage and generates the first reference clock signal with an adjustable frequency.

Still referring to FIG. 11, the initial clock generation sub-circuit 202 may be further connected to the control word generation circuit 10 and the spread spectrum clock generation circuit 30 (for example, the voltage conversion sub-circuit 301 in the spread spectrum clock generation circuit 30). The initial clock generation sub-circuit 202 may be configured to generate an initial clock signal based on the first frequency control word F1, the second frequency control word F2 and the plurality of second reference clock signals, and output the initial clock signal to the spread spectrum clock generation circuit 30.

Figure 12:
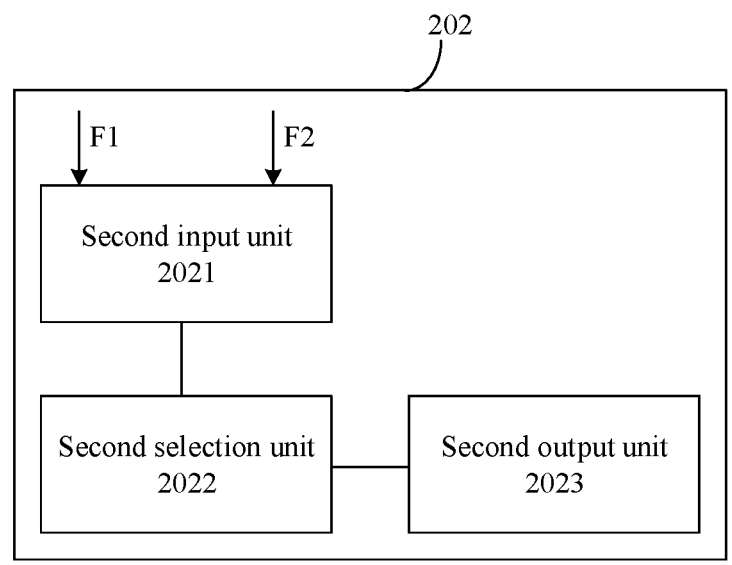
FIG. 12 is a schematic structural diagram of an initial clock generation sub-circuit according to an embodiment of the present disclosure.

Optionally, FIG. 12 is a schematic structural diagram of the initial clock generation sub-circuit 202 according to an embodiment of the present disclosure. As shown in FIG. 12, the initial clock generation sub-circuit 202 may include a second input unit 2021, a second selection unit 2022 and a second output unit 2023.

The second input unit 2021 may be connected to the control word generation circuit 10 (not shown in the figure) and the second selection unit 2022. The second input unit 2021 may be configured to output a second selection control signal to the second selection unit 2022 based on the first frequency control word F1 and the second frequency control word F2.

The second selection unit 2022 may be further connected to the second reference clock generation sub-circuit 201 and the second output unit 2023. The second selection unit 2022 may be configured to select a second candidate clock signal from the plurality of second reference clock signals in response to the second selection control signal, and output the second candidate clock signal to the second output unit 2023.

The second output unit 2023 may be further connected to the spread spectrum clock generation circuit 30 (not shown in the figure). The second output unit 2023 may be configured to generate the initial clock signal based on the second candidate clock signal, and output the initial clock signal to the spread spectrum clock generation circuit 30.

Optionally, with reference to FIG. 8 and FIG. 9, the structure and operating principle of the units in the initial clock generation sub-circuit 202 are the same as those of the units in the spread spectrum clock generation sub-circuit 303, and details are not described herein. The difference lies in that the initial clock generation sub-circuit 202 and the spread spectrum clock generation sub-circuit 303 receive different frequency control words, and correspondingly output different results. Therefore, the initial clock generation sub-circuit 202 may also be the TAF-DPS circuit. Assuming that TAF-DPS1 is used to denote the spread spectrum clock generation sub-circuit 303 and TAF-DPS2 is used to denote the initial clock generation sub-circuit 202, then TAF-DPS2 is mainly configured to generate the initial clock signal with the target duty ratio. Correspondingly, to ensure the stability of the generated initial clock signal, the first frequency control word F1 and the second frequency control word F2 provided by the control word generation circuit 10 to the initial clock generation sub-circuit 202 may both be positive integers.

Assuming that the first frequency control word F1 and the second frequency control word F2 are both positive integers, it may be determined with reference to the above descriptions of the operating principle of the TAF-DPS that the period T2 of the initial clock signal output from the initial clock generation sub-circuit 202 may satisfy:

$$T2=F1\times\Delta=I12\times\Delta=T_A=F2\times\Delta+(F1-F2)\times\Delta \qquad \text{formula (9)};$$

where I12 is the integer part of the first frequency control word F1, and the first frequency control word F1 has no fractional part.

By setting the TAF-DPS1 and TAF-DPS2, it can be ensured that the range of adjusting the frequency is wider during the spread spectrum processing. In addition, because TAF-DPS2 can generate the initial clock signal with the target duty ratio, the voltage conversion sub-circuit 301 may directly change the initial voltage provided by the power supply 40 based on the initial clock signal with the target duty ratio, which ensures the precision of adjustment, and ensures the precision of the generated spread spectrum clock signal.

With reference to the above embodiments, it can be known that the entire process of generating the spread spectrum clock signal by using the clock signal generation circuit provided in the embodiments of the present disclosure can be summarized as follows.

The second reference clock generation sub-circuit 201 (for example, the second RO RO2) first generates a plurality of (for example, k) second reference clock signals with the frequency f2 under drive of the reference voltage and outputs the second reference clock signals to the initial clock generation sub-circuit 202 (for example, TAF-DPS2). The initial clock generation sub-circuit 202 then generates the initial clock signal with the target duty ratio based on the received first frequency control word F1, second frequency control word F2, and the quantity k and frequency f2 of the second reference clock signals, and outputs the initial clock signal to the voltage conversion sub-circuit 301. Next, the voltage conversion sub-circuit 301 converts the initial voltage provided by the power supply 40 to the target voltage based on the target duty ratio and provides the target voltage to the first reference clock generation sub-circuit 302. The first reference clock generation sub-circuit 302 (for example, the first RO RO1) may then operate at the target voltage and generate the plurality of (for example, k) first reference clock signals with the frequency f1, and output the first reference clock signals to the spread spectrum clock generation sub-circuit 303 (for example, TAF-DPS2). Finally, the spread spectrum clock generation sub-circuit 303 may generate the spread spectrum clock signal based on the received third frequency control word F3 and first reference clock signals.

For example, assuming that delta modulation is to be performed on the initial clock signal, then the first frequency control word F1 may be controlled to be unchanged and the second frequency control word F2 is adjusted uniformly within a certain range. For example, the control word generation circuit 10 may uniformly adjust the generated second frequency control word F2 in the range of 25 to 75 with an adjustment step of 1. Since the target voltage Vo satisfies: Vo=Vi×μ×D=Vi×μ×(F2/F1), it can be known that Vo changes uniformly in the case that F2 changes uniformly. Uniform change of Vo causes uniform change of the oscillation frequency of the first reference clock generation sub-circuit 302, i.e., the first RO RO1, thereby uniformly adjusting of the frequency f1 of the second reference clock signal. Because the period T0 of the spread spectrum clock signal finally generated by the spread spectrum clock generation sub-circuit 303 satisfies: T0=1/(F3×k×f1), it can be known that T0 changes with the frequency f1. Thus, delta modulation can be achieved.

Certainly, to achieve other types of modulation, the required spread spectrum parameter needs to be output to the control word generation circuit 10. The second frequency control words F2 generated by the control word generation circuit 10 based on different spread spectrum parameters form different types of modulation based on different change rules, such that the spread spectrum clock generation circuit 30 performs different spread spectrum processing on the initial clock signal. The entire circuit structure has high spread spectrum efficient, a simple structure, a small size, and low power consumption, which can ensure normal operation of the electronic device, but also reliably suppress the electromagnetic interference.

In summary, this embodiment of the present disclosure provides a clock signal generation circuit. In the clock signal generation circuit, digital circuits such as the control word generation circuit, the initial clock generation circuit, and the spread spectrum clock generation circuit first generate the frequency control words based on the spread spectrum parameter, generate the initial clock signal with the target duty ratio based on the frequency control words, and perform the spread spectrum processing based on the target duty ratio of the initial clock signals to acquire the spread spectrum clock signal. That is, the entire spread spectrum process is performed by the digital circuits. Therefore, the electronic device including the clock signal generation circuit does not need to be controlled to stop working, that is, the normal operation of the electronic device is not affected. In addition, the clock signal generation circuit provided in the present disclosure can adjust in real time various spread spectrum parameters (for example, the modulation depth) that affect the spread spectrum result, and thus the spread spectrum flexibility is high.

Figure 13:
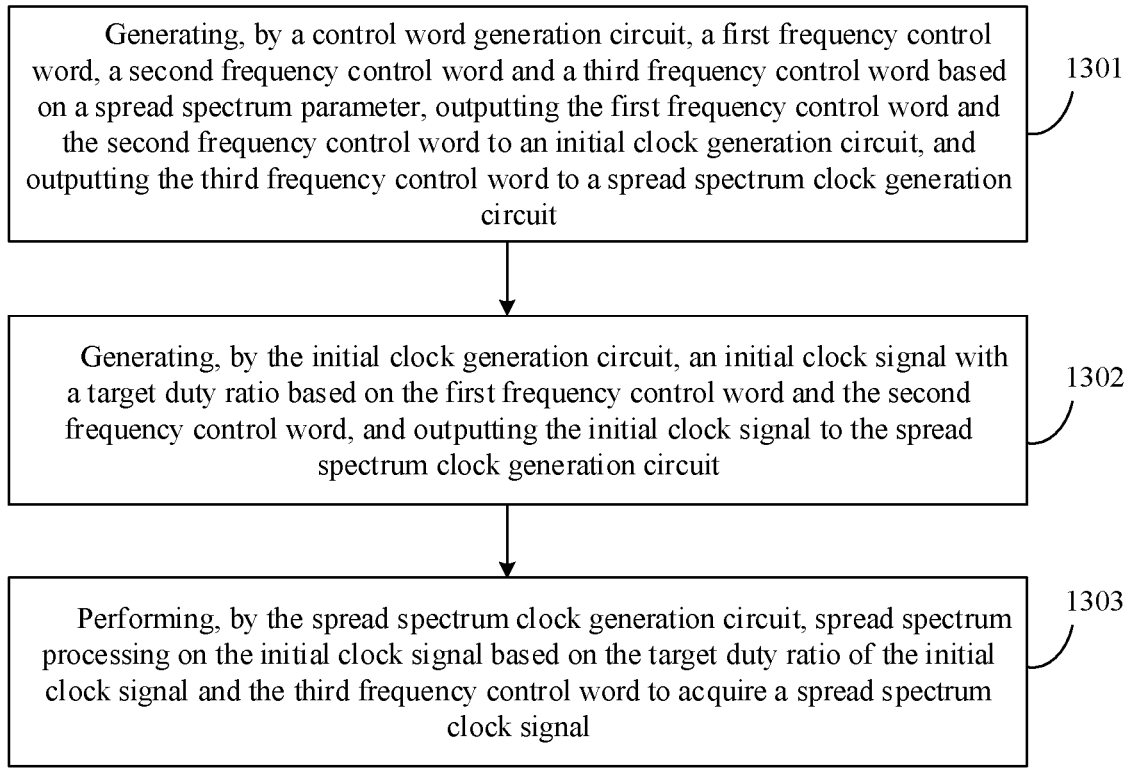
FIG. 13 is a flowchart of a clock signal generation method according to an embodiment of the present disclosure.

FIG. 13 is a clock signal generation method according to an embodiment of the present disclosure. The method may be applicable to the clock signal generation circuit as shown in FIG. 1, FIG. 3 or FIG. 11. As shown in FIG. 13, the method may include the following steps.

In step 1301, a control word generation circuit generates a first frequency control word, a second frequency control word and a third frequency control word based on a spread spectrum parameter, outputs the first frequency control word and the second frequency control word to an initial clock generation circuit, and outputs the third frequency control word to a spread spectrum clock generation circuit.

In step 1302, the initial clock generation circuit generates an initial clock signal with a target duty ratio based on the first frequency control word and the second frequency control word, and outputs the initial clock signal to the spread spectrum clock generation circuit.

In step 1303, the spread spectrum clock generation circuit performs spread spectrum processing on the initial clock signal based on the target duty ratio of the initial clock signal and the third frequency control word to acquire a spread spectrum clock signal.

In summary, this embodiment of the present disclosure provides a clock signal generation method. According to this method, the frequency control words can be generated based on the spread spectrum parameter, the initial clock signal with the target duty ratio can be generated based on the frequency control words, and the spread spectrum processing can be performed based on the target duty ratio of the initial clock signal to acquire the spread spectrum clock signal The entire spread spectrum process is digital processing, and the electronic device including the clock signal generation circuit does not need to be controlled to stop working, that is, the normal operation of the electronic device is not affected. In addition, the modulation depth, the modulation type and/or the center frequency can be adjusted in real time, and thus the spread spectrum flexibility is high.

It should be noted that for optional structures of the circuits in the clock signal generation circuit, and corresponding optional implementations of steps 1301 to 1303, reference may be made to the above descriptions in the method embodiments, and details are not repeated in the method embodiments.

Figure 14:
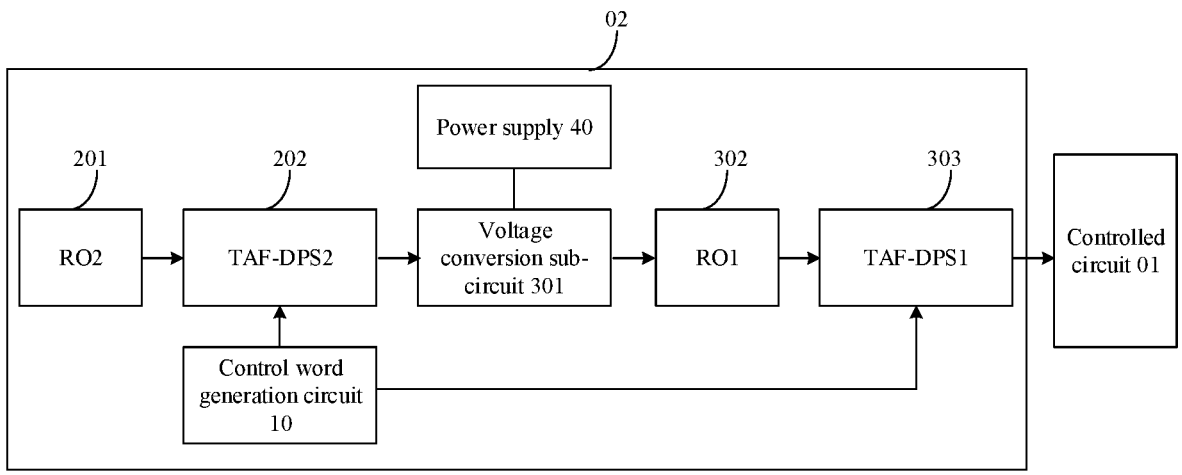
FIG. 14 is a schematic structural diagram of an electronic device according to an embodiment of the present disclosure.

FIG. 14 is a schematic structural diagram of an electronic device according to an embodiment of the present disclosure. As shown in FIG. 14, the electronic device may include a controlled circuit 01 and the clock signal generation circuit 02 shown in FIG. 1, FIG. 3 or FIG. 11.

The clock signal generation circuit 02 may be connected to the controlled circuit 01, and the controlled circuit 01 may be configured to operate in response to a spread spectrum clock signal output from the clock signal generation circuit 02.

For example, FIG. 14 shows the schematic diagram of the clock signal generation circuit 02 by taking an example in which the first reference clock generation sub-circuit 302 and the second reference clock generation sub-circuit 201 are both ROs (RO1 and RO2) and the spread spectrum clock generation sub-circuit 303 and the initial clock generation sub-circuit 202 are both TAF-DPS circuits (TAF-DPS1 and TAF-DPS2).

It should be understood that the term "and/or" in this specification may indicates three kinds of relationships. For example, A and/or B may be expressed as: A exists alone, A and B concurrently, or B exists alone. The character "/" generally indicates that the associated objects are in an "or" relationship.

Persons skilled in the art may clearly understand that, for the convenience and brevity of descriptions, reference may be made to the corresponding operating processes of the circuits, sub-circuits, units and devices in the clock signal generation circuit in the foregoing device embodiments for the specific implementations of the clock signal generation method. Details are not described herein again.

The foregoing descriptions are merely optional embodiments of the present disclosure and are not intended to limit the present disclosure. Any modifications, equivalent substitutions, and improvements within the spirit and principle of the present disclosure shall be included within the protection scope of the present disclosure.

What is claimed is:

1. A clock signal generation circuit, comprising a control word generation circuit, an initial clock generation circuit and a spread spectrum clock generation circuit, wherein
    the control word generation circuit is connected to the initial clock generation circuit and the spread spectrum clock generation circuit, and the control word generation circuit is configured to generate a first frequency control word, a second frequency control word and a third frequency control word based on a spread spectrum parameter, output the first frequency control word and the second frequency control word to the initial clock generation circuit, and output the third frequency control word to the spread spectrum clock generation circuit;

the initial clock generation circuit is further connected to the spread spectrum clock generation circuit, and the initial clock generation circuit is configured to generate an initial clock signal with a target duty ratio based on the first frequency control word and the second frequency control word and output the initial clock signal to the spread spectrum clock generation circuit; and the spread spectrum clock generation circuit is configured to perform spread spectrum processing on the initial clock signal based on the target duty ratio of the initial clock signal and the third frequency control word to acquire a spread spectrum clock signal.

2. The clock signal generation circuit according to claim 1, wherein the spread spectrum clock generation circuit comprises a voltage conversion sub-circuit, a first reference clock generation sub-circuit and a spread spectrum clock generation sub-circuit, wherein the voltage conversion sub-circuit is connected to the initial clock generation circuit and the first reference clock generation sub-circuit, and the voltage conversion sub-circuit is configured to convert an initial voltage to a target voltage based on the target duty ratio of the initial clock signal and provide the target voltage to the first reference clock generation sub-circuit;

the first reference clock generation sub-circuit is further connected to the spread spectrum clock generation sub-circuit, and the first reference clock generation sub-circuit is configured to generate a plurality of first reference clock signals under drive of the target voltage and output the plurality of first reference clock signals to the spread spectrum clock generation sub-circuit, wherein a phase difference between every two adjacent first reference clock signals is the same; and the spread spectrum clock generation sub-circuit is further connected to the control word generation circuit, and the spread spectrum clock generation sub-circuit is configured to perform the spread spectrum processing on the initial clock signal based on the third frequency control word and the plurality of first reference clock signals to acquire the spread spectrum clock signal.

3. The clock signal generation circuit according to claim 2, wherein the first reference clock generation sub-circuit comprises a first ring oscillator (RO).

4. The clock signal generation circuit according to claim 2, wherein the spread spectrum clock generation sub-circuit comprises a first input unit, a first selection unit and a first output unit, wherein the first input unit is connected to the control word generation circuit and the first selection unit, and the first input unit is configured to output a first selection control signal to the first selection unit based on the third frequency control word;

the first selection unit is further connected to the first reference clock generation sub-circuit and the first output unit, and the first selection unit is configured to select a first candidate clock signal from the plurality of first reference clock signals in response to the first selection control signal and output the first candidate clock signal to the first output unit; and the first output unit is configured to perform the spread spectrum processing on the initial clock signal based on the first candidate clock signal to acquire the spread spectrum clock signal.

5. The clock signal generation circuit according to claim 2, further comprising: a power supply, wherein the power supply is connected to the voltage conversion sub-circuit, and the power supply is configured to provide the initial voltage to the voltage conversion sub-circuit.

6. The clock signal generation circuit according to claim 1, wherein the initial clock generation circuit comprises a second reference clock generation sub-circuit and an initial clock generation sub-circuit, wherein the second reference clock generation sub-circuit is connected to the initial clock generation sub-circuit, and the second reference clock generation sub-circuit is configured to generate a plurality of second reference clock signals under drive of a reference voltage and output the plurality of second reference clock signals to the initial clock generation sub-circuit, wherein a phase difference between any two adjacent second reference clock signals is the same; and the initial clock generation sub-circuit is further connected to the control word generation circuit and the spread spectrum clock generation circuit, and the initial clock generation sub-circuit is configured to generate the initial clock signal based on the first frequency control word, the second frequency control word and the plurality of second reference clock signals and output the initial clock signal to the spread spectrum clock generation circuit.

7. The clock signal generation circuit according to claim 6, wherein the second reference clock generation sub-circuit comprises a second RO.

8. The clock signal generation circuit according to claim 6, wherein the initial clock generation sub-circuit comprises a second input unit, a second selection unit and a second output unit, wherein the second input unit is connected to the control word generation circuit and the second selection unit, and the second input unit is configured to output a second selection control signal to the second selection unit based on the first frequency control word and the second frequency control word;

the second selection unit is further connected to the second reference clock generation sub-circuit and the second output unit, and the second selection unit is configured to select a second candidate clock signal from the plurality of second reference clock signals in response to the second selection control signal and output the second candidate clock signal to the second output unit; and the second output unit is further connected to the spread spectrum clock generation circuit, and the second output unit is configured to generate the initial clock signal based on the second candidate clock signal and output the initial clock signal to the spread spectrum clock generation circuit.

9. The clock signal generation circuit according to claim 1, wherein the first frequency control word and the second frequency control word are both positive integers.

10. The clock signal generation circuit according to claim 1, wherein the third frequency control word comprises an integer part and a fractional part.

11. The clock signal generation circuit according to claim 1, wherein the spread spectrum parameter comprises at least one of a modulation type parameter, a modulation depth parameter and a center frequency parameter.

12. The clock signal generation circuit according to claim 8, wherein the spread spectrum clock generation sub-circuit comprises a first input unit, a first selection unit and a first output unit, wherein the first input unit is connected to the control word generation circuit and the first selection unit, and the first input unit is configured to output a first selection control signal to the first selection unit based on the third frequency control word; the first selection unit is further connected to the first reference clock generation sub-circuit and the first output unit, and the first selection unit is configured to select a first candidate clock signal from the plurality of first reference clock signals in response to the first selection control signal and output the first candidate clock signal to the first output unit; and the first output unit is configured to perform the spread spectrum processing on the initial clock signal based on the first candidate clock signal to acquire the spread spectrum clock signal;

the clock signal generation circuit further comprises a power supply, wherein the power supply is connected to the voltage conversion sub-circuit, and the power supply is configured to provide the initial voltage to the voltage conversion sub-circuit;

the second reference clock generation sub-circuit comprises a second RO;

the first frequency control word and the second frequency control word are both positive integers, and the third frequency control word comprises an integer part and a fractional part; and the spread spectrum parameter comprises at least one of a modulation type parameter, a modulation depth parameter and a center frequency parameter.

13. A clock signal generation method, comprising:

generating, by a control word generation circuit, a first frequency control word, a second frequency control word and a third frequency control word based on a spread spectrum parameter, and outputting, by the control word generation circuit, the first frequency control word and the second frequency control word to an initial clock generation circuit and the third frequency control word to a spread spectrum clock generation circuit;

generating, by the initial clock generation circuit, an initial clock signal with a target duty ratio based on the first frequency control word and the second frequency control word, and outputting, by the initial clock generation circuit, the initial clock signal to the spread spectrum clock generation circuit; and performing, by the spread spectrum clock generation circuit, spread spectrum processing on the initial clock signal based on the target duty ratio of the initial clock signal and the third frequency control word to acquire a spread spectrum clock signal.

14. The method according to claim 13, wherein the spread spectrum clock generation circuit comprises a voltage conversion sub-circuit, a first reference clock generation sub-circuit and a spread spectrum clock generation sub-circuit; and performing by the spread spectrum clock generation circuit the spread spectrum processing on the initial clock signal based on the target duty ratio of the initial clock signal and the third frequency control word to acquire the spread spectrum clock signal comprises:

converting, by the voltage conversion sub-circuit, an initial voltage to a target voltage based on the target duty ratio of the initial clock signal, and providing, by the voltage conversion sub-circuit, the target voltage to the first reference clock generation sub-circuit;

generating, by the first reference clock generation sub-circuit, a plurality of first reference clock signals under drive of the target voltage, and outputting, by the first reference clock generation sub-circuit, the plurality of first reference clock signals to the spread spectrum clock generation sub-circuit, wherein a phase difference between any two adjacent first reference clock signals is the same; and performing, by the spread spectrum clock generation sub-circuit, the spread spectrum processing on the initial clock signal based on the third frequency control word and the plurality of first reference clock signals to acquire the spread spectrum clock signal.

15. An electronic device, comprising: a controlled circuit and a clock signal generation circuit, wherein the clock signal generation circuit is connected to the controlled circuit, and the controlled circuit is configured to operate in response to a spread spectrum clock signal output from the clock signal generation circuit; and the clock signal generation circuit comprises a control word generation circuit, an initial clock generation circuit and a spread spectrum clock generation circuit, wherein the control word generation circuit is connected to the initial clock generation circuit and the spread spectrum clock generation circuit, and the control word generation circuit is configured to generate a first frequency control word, a second frequency control word and a third frequency control word based on a spread spectrum parameter, output the first frequency control word and the second frequency control word to the initial clock generation circuit, and output the third frequency control word to the spread spectrum clock generation circuit;

the initial clock generation circuit is further connected to the spread spectrum clock generation circuit, and the initial clock generation circuit is configured to generate an initial clock signal with a target duty ratio based on the first frequency control word and the second frequency control word and output the initial clock signal to the spread spectrum clock generation circuit; and the spread spectrum clock generation circuit is configured to perform spread spectrum processing on the initial clock signal based on the target duty ratio of the initial clock signal and the third frequency control word to acquire a spread spectrum clock signal.

16. The electronic device according to claim 15, wherein the spread spectrum clock generation circuit comprises a voltage conversion sub-circuit, a first reference clock generation sub-circuit and a spread spectrum clock generation sub-circuit, wherein the voltage conversion sub-circuit is connected to the initial clock generation circuit and the first reference clock generation sub-circuit, and the voltage conversion sub-circuit is configured to convert an initial voltage to a target voltage based on the target duty ratio of the initial clock signal and provide the target voltage to the first reference clock generation sub-circuit;

the first reference clock generation sub-circuit is further connected to the spread spectrum clock generation sub-circuit, and the first reference clock generation sub-circuit is configured to generate a plurality of first reference clock signals under drive of the target voltage and output the plurality of first reference clock signals to the spread spectrum clock generation sub-circuit, wherein a phase difference between every two adjacent first reference clock signals is the same; and the spread spectrum clock generation sub-circuit is further connected to the control word generation circuit, and the spread spectrum clock generation sub-circuit is configured to perform the spread spectrum processing on the initial clock signal based on the third frequency control word and the plurality of first reference clock signals to acquire the spread spectrum clock signal.

17. The electronic device according to claim 16, wherein the first reference clock generation sub-circuit comprises a first ring oscillator (RO).

18. The electronic device according to claim 16, wherein the spread spectrum clock generation sub-circuit comprises a first input unit, a first selection unit and a first output unit, wherein the first input unit is connected to the control word generation circuit and the first selection unit, and the first input unit is configured to output a first selection control signal to the first selection unit based on the third frequency control word;

the first selection unit is further connected to the first reference clock generation sub-circuit and the first output unit, and the first selection unit is configured to select a first candidate clock signal from the plurality of first reference clock signals in response to the first selection control signal and output the first candidate clock signal to the first output unit; and the first output unit is configured to perform the spread spectrum processing on the initial clock signal based on the first candidate clock signal to acquire the spread spectrum clock signal.

19. The electronic device according to claim 16, further comprising: a power supply, wherein the power supply is connected to the voltage conversion sub-circuit, and the power supply is configured to provide the initial voltage to the voltage conversion sub-circuit.

20. The electronic device according to claim 15, wherein the initial clock generation circuit comprises a second reference clock generation sub-circuit and an initial clock generation sub-circuit, wherein the second reference clock generation sub-circuit is connected to the initial clock generation sub-circuit, and the second reference clock generation sub-circuit is configured to generate a plurality of second reference clock signals under drive of a reference voltage and output the plurality of second reference clock signals to the initial clock generation sub-circuit, wherein a phase difference between any two adjacent second reference clock signals is the same; and the initial clock generation sub-circuit is further connected to the control word generation circuit and the spread spectrum clock generation circuit, and the initial clock generation sub-circuit is configured to generate the initial clock signal based on the first frequency control word, the second frequency control word and the plurality of second reference clock signals and output the initial clock signal to the spread spectrum clock generation circuit.

* * * * *